(12) United States Patent
Snider

(10) Patent No.: US 9,342,780 B2
(45) Date of Patent: May 17, 2016

(54) SYSTEMS AND METHODS FOR MODELING BINARY SYNAPSES

(75) Inventor: Gregory Stuart Snider, Los Altos, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 468 days.

(21) Appl. No.: 13/813,128

(22) PCT Filed: Oct. 13, 2010

(86) PCT No.: PCT/US2010/052490
§ 371 (c)(1),
(2), (4) Date: Jan. 29, 2013

(87) PCT Pub. No.: WO2012/015450
PCT Pub. Date: Feb. 2, 2012

(65) Prior Publication Data
US 2013/0132314 A1 May 23, 2013

Related U.S. Application Data

(60) Provisional application No. 61/369,603, filed on Jul. 30, 2010.

(51) Int. Cl.
*G06N 3/02* (2006.01)
*G06N 3/063* (2006.01)
(52) U.S. Cl.
CPC .................. *G06N 3/02* (2013.01); *G06N 3/063* (2013.01); *G06N 3/0635* (2013.01)
(58) Field of Classification Search
CPC ....................................................... G06N 3/02

USPC ............................................................ 706/15
See application file for complete search history.

(56) References Cited

U.S. PATENT DOCUMENTS

| 4,891,782 A * | 1/1990 | Johnson .................. 708/706 |
| 2009/0163826 A1* | 6/2009 | Mouttet .................. 600/544 |

FOREIGN PATENT DOCUMENTS

| JP | 11-134314 | 5/1999 |
| JP | 2002-502522 | 1/2002 |
| KR | 10-2005-0007309 | 1/2005 |
| KR | 10-2008-0098357 | 11/2008 |

OTHER PUBLICATIONS

The International Search Report and the Written Opinion of the International Searching Authority, or the Declaration; PCT/US2010/052490; Filed Oct. 13, 2010.

* cited by examiner

*Primary Examiner* — Stanley K Hill
*Assistant Examiner* — Ola Olude Afolabi
(74) *Attorney, Agent, or Firm* — Olympic Patent Works PLLC

(57) ABSTRACT

Methods and system for modeling the behavior of binary synapses are provided. In one aspect, a method of modeling synaptic behavior includes receiving an analog input signal and transforming the analog input signal into an N-bit codeword, wherein each bit of the N-bit codeword is represented by an electronic pulse. The method includes loading the N-bit codeword into a circular shift register and sending each bit of the N-bit codeword through one of N switches. Each switch applies a corresponding weight to the bit to produce a weighted bit. A signal corresponding to a summation of the weighted bits is output and represents a synaptic transfer function characterization of a binary synapse.

19 Claims, 16 Drawing Sheets

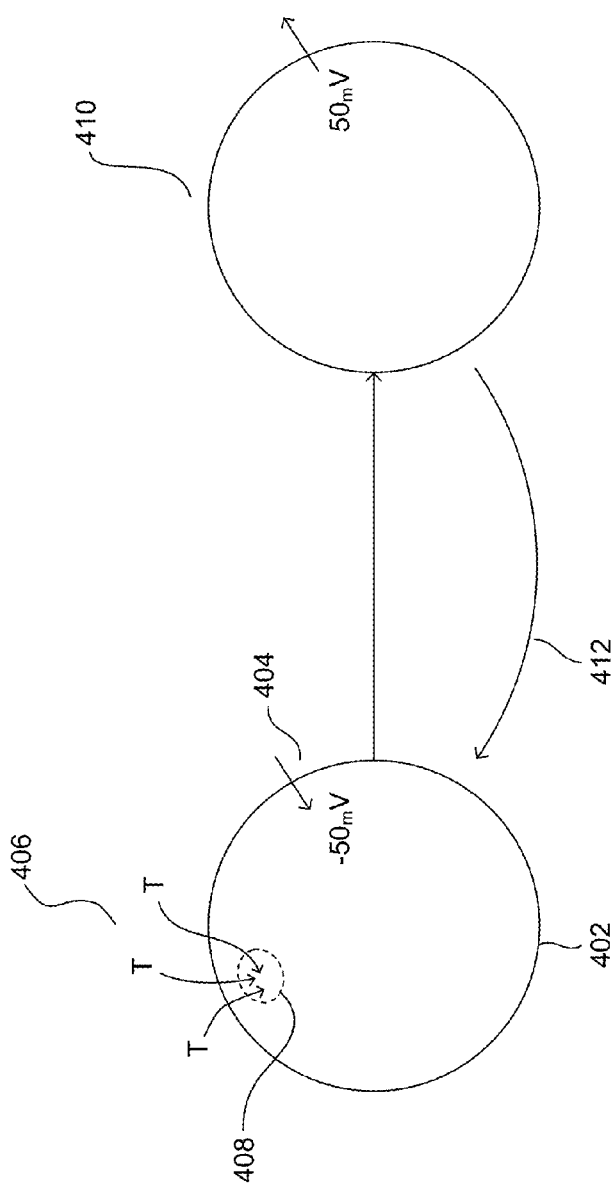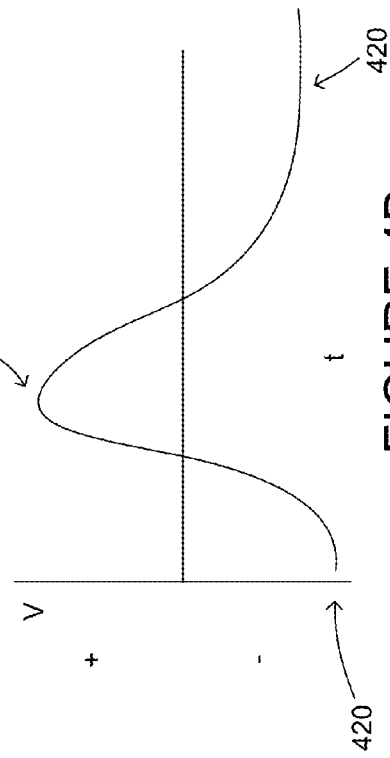
FIGURE 4A
FIGURE 4B

F = amount of synaptic strengthening

SYSTEMS AND METHODS FOR MODELING BINARY SYNAPSES

CROSS-REFERENCE TO RELATED APPLICATIONS

This application is a U.S. National Stage Application of and claims priority to International Patent Application No. PCT/US2010/052490, filed on Oct. 13, 2010, and entitled "SYSTEMS AND METHODS FOR MODELING BINARY SYNAPSES," which claims priority to U.S. Provisional Patent Application No. 61/369,603, filed Jul. 30, 2010, entitled "SYSTEMS AND METHODS FOR MODELING BINARY SYNAPSES."

STATEMENT OF GOVERNMENT INTEREST

This invention was made with government support under Contract No. HR0011-09-3-0001, awarded by Defense Advanced Research Projects Agency. The government has certain rights in the invention.

TECHNICAL FIELD

Examples of the present invention are directed to systems and methods that model binary synapses.

BACKGROUND

Early in the history of computing, computer scientists became interested in biological computing structures, including the human brain. Although sequential-instruction-processing engines have technologically evolved with extreme rapidity during the past 50 years, many seemingly straightforward problems cannot be effectively addressed by even the largest and highest-speed distributed computer systems and networks. One trivial example is the interpretation of photographs and video images. A human can, often in a fraction of a second, glance at a photograph and accurately interpret objects, interrelationships between objects, and the spatial organization of objects represented by the two-dimensional photograph, while such interpretation of photographic images is currently beyond the ability of the largest computer systems running the cleverest algorithms.

Extensive research efforts have been expended in investigating the structure and function of the human brain. Many of the fundamental computational entities in such biological systems have been identified and characterized physiologically, at microscale dimensions as well as at the molecular level. For example, the neuron, a type of cell responsible for signal processing and signal transmission within the human brain, is relatively well understood and well characterized, although much yet remains to be learned. This understanding of neuron function has inspired a number of fields in computer science, including neural-network and perception-network subfields of artificial intelligence. Many successful software implementations of neural networks have been developed to address a variety of different applications, including pattern recognition, diagnosis of the causes of complex phenomena, various types of signal processing and signal denoising, and other applications. However, the human brain is massively parallel from a structural standpoint, and while such parallelism can be simulated by software implementations and neural networks, the simulations are generally processor-cycle bound, because the simulations necessarily run on one or a relatively small number of sequential instruction-processing engines, rather than making use of physical parallelism within the computing system. Thus, neural networks may provide tolerance to noise, learning capabilities, and other desirable characteristics, but do not currently provide the extremely fast and high-bandwidth computing capabilities of massively parallel biological computational structures.

In order to achieve the extremely fast and high-bandwidth computing capabilities of biological computational structures in physical, manufactured devices, computational tasks are typically carried out on massively parallel and interconnected networks of computational nodes. Many different approaches for implementing physical neural networks have been proposed, but implementations have so far have fallen fall short of the speed, parallelism, and computational capacity of even relatively simple biological structures. In addition, design and manufacture of massively parallel hardware is fraught with any number of different practical problems, including reliable manufacture of large numbers of dynamical connections, size and power constraints, heat dissipation, reliability, flexibility, including programmability, and many other such considerations. However, unlike many theoretical problems, for which it is unclear whether or not solutions can be found, the fact that computational biological structures, including the human brain, exist, and perform spectacular feats of computation on a regular basis would suggest that the goal of designing and constructing computational devices with similar computational capacities and efficiencies is quite possible.

Computer scientists, hardware designers, researchers focused on artificial intelligence, biological intelligence, and a wide variety of different fields within computer science and information sciences, continue to seek advancements in physical, hardware devices suitable for implementing the types of massively parallel, distributed, dynamical processing that occurs within the human brain and other computational biological structures.

BRIEF DESCRIPTION OF THE DRAWINGS

FIGS. 4A-4B show a neuron firing.

DETAILED DESCRIPTION

This disclosure is directed to systems and methods that model Instar and Outstar synaptic behavior. Populations of synapses are modeled as dynamical, two-terminal devices that connect pre-synaptic neurons called "source neuron" or "source" to post-synaptic neurons called a "sink neuron" or a "sink." The source emits an analog source signal that is modified by a synaptic transfer function and delivered to the sink. The synaptic transfer function depends on at least one continuous state variable that evolves over time as a function of the signals sent by the source and the state of the sink. The combination of a synaptic transfer function and state evolution equation models the behavior of a population of synapses. Systems and methods of the present invention are based on an Instar and Outstar model of synaptic behavior with two-terminal switches. In particular, the binary, two-terminal switches can be implemented using memristive nanodevices, because such devices can be densely packed using crossbar arrays and posses a long time constant, or memory.

I. Biological Neurons and Synapses

Neurons are a type of cell found in the brains of animals. Neurons are thought to be one of, if not the, fundamental biological computational entity. It is estimated that the human brain contains on the order of 100 billion ($10^{11}$) neurons and on the order of 100 trillion ($10^{14}$) interconnections between neurons. The massive number of interconnections between neurons in the human brain is thought to be directly correlated with the massively parallel nature of biological computing.

Figure 1:
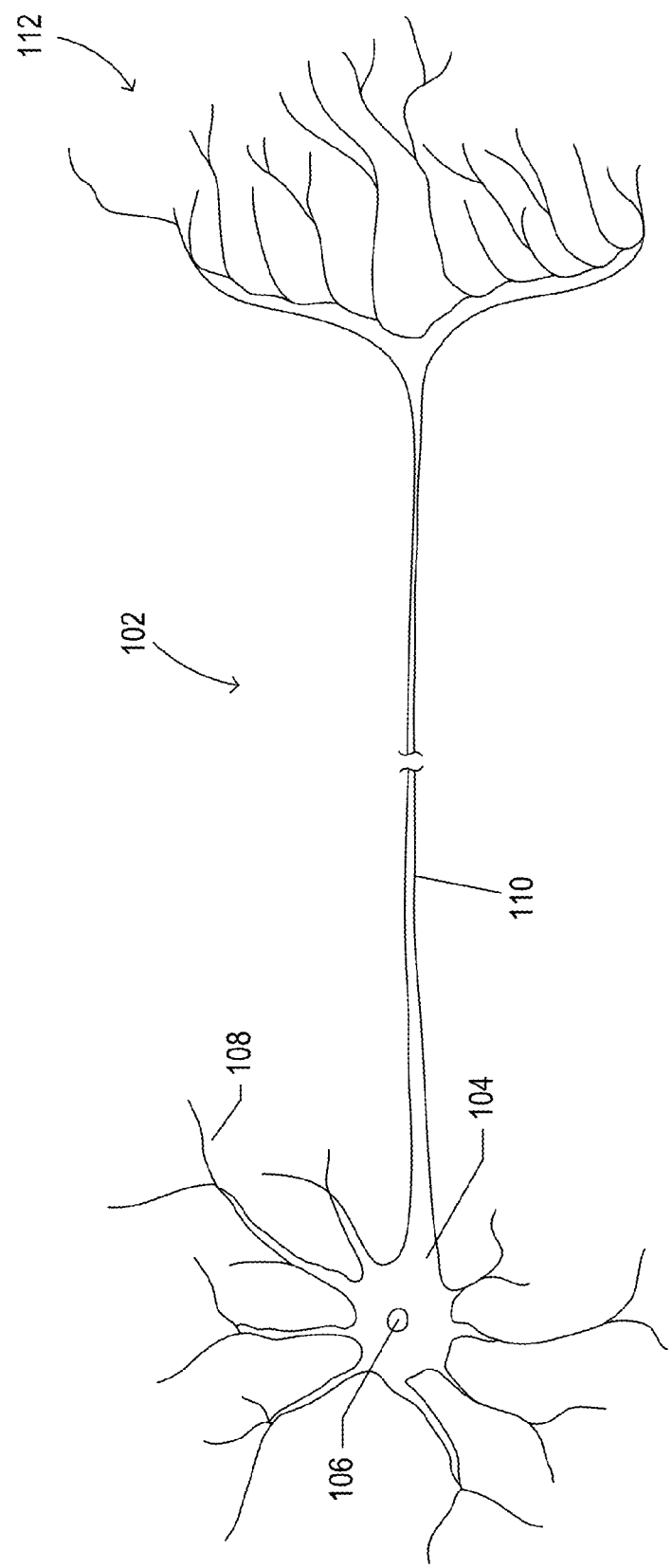
FIG. 1 shows a generalized and stylized illustration of a neuron.

Each neuron is a single cell. FIG. 1 shows a generalized and stylized illustration of a neuron. The neuron 102 includes a cell body 104 containing the cell nucleus 106 and various organelles, including mitochondria, a number of branching dendrites, such as dendrite 108, emanating from the cell body 104, and generally one very long axon 110 that terminates in many branching extensions 112. In general, the dendrites provide an enlarged neuron-surface area for receiving signals from other neurons, while the axon serves to transmit signals from the neuron to other neurons. The terminal branches of the axon 112 interface with the dendrites, and less frequently with the cell bodies, of other neurons. A single neuron may receive as many as 100,000 different signal inputs. Similarly, a neuron may transmit signals to tens, hundreds, or even thousands of downstream neurons. Neurons vary tremendously, within a given individual, with respect to the number of, and degree of branching of, dendrites and terminal axon extensions as well as with respect to volume and length. For example, axons range in length from significantly less than one millimeter to over one meter. This flexibility in axon length and connectivity allow for hierarchical cascades of signal paths and extremely complex connection-based organizations of signaling paths and cascades within the brain.

Figure 2:
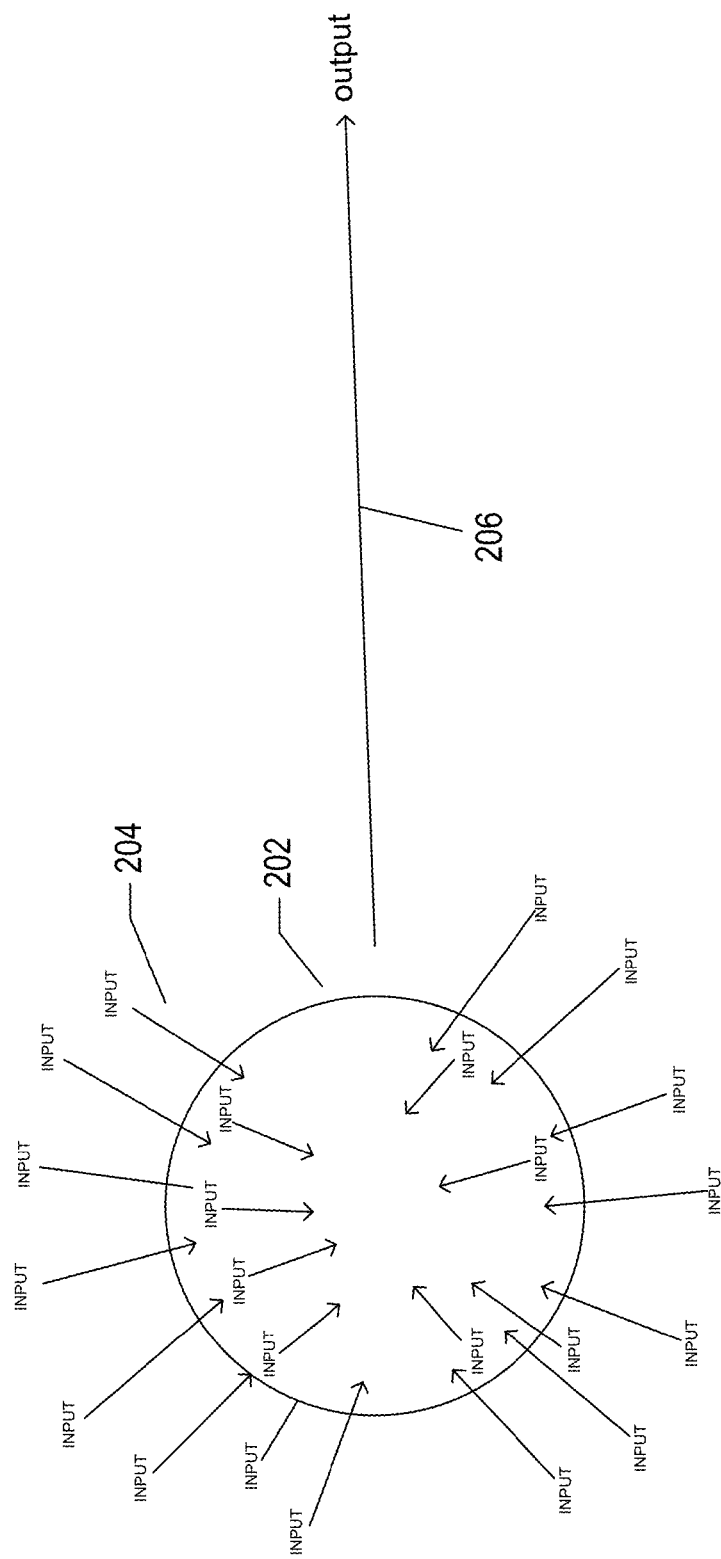
FIG. 2 shows a more abstract representation of a neuron.

FIG. 2 shows a more abstract representation of a neuron. A neuron can, in general, be thought of as a node 202 that receives input signals from multiple inputs, such as input 204, and depending on the temporal and spatial characteristics of the inputs, responds to input stimuli of greater than a threshold intensity by firing an output signal 206. In other words, the neuron can be thought of as a very complex input-signal integrator combined with a thresholder and a signal-generation and signal-output mechanism. When the signal integrator accumulates a sufficient number of input signals over a bounded period of time and within a sufficiently small area of the node surface, the neuron responds by firing an output signal.

As mentioned above, input signals received by a given neuron are generated by output signals of other neurons connected to the given neuron by synapse junctions between the other neurons' terminal axon branches and the given neuron's dendrites. These synapses, or connections, between neurons have dynamically adjusted connection strengths, or weights. The adjustment of the connection strengths, or weights, is thought to significantly contribute to both learning and memory, and represents a significant portion of parallel computation within the brain.

Figure 3:
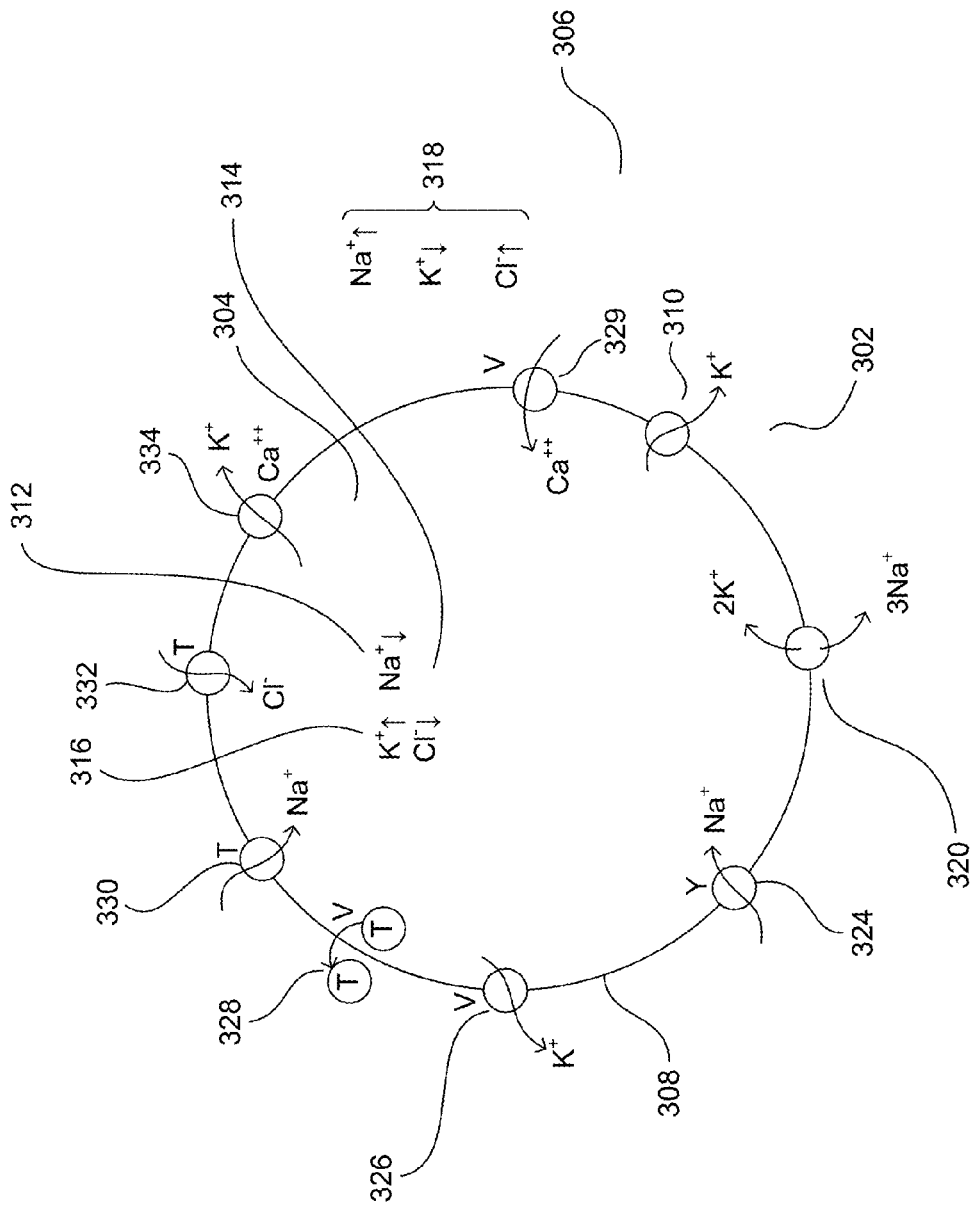
FIG. 3 is an abstract representation of a neuron cell, showing the different types of electrochemical gradients and channels in the neuron's outer membrane that control, and respond, to electrochemical gradients and signals and that are used to trigger neuron output signal firing.

Neuron functionalities are derived from, and depend on, complex electrochemical gradients and ion channels. FIG. 3 is an abstract representation of a neuron cell, showing the different types of electrochemical gradients and channels in the neuron's outer membrane that control, and respond, to electrochemical gradients and signals and that are used to trigger neuron output signal firing. In FIG. 3, the neuron is represented as a spherical, membrane-enclosed cell 302, the contents of which 304 are separated from the external environment 306 by a double-walled, hydrophobic membrane 308 that includes various types of channels, such as channel 310. The various types of channels provide for controlled chemical communication between the interior of the neuron and the external environment.

The channels primarily responsible for neuron characteristics are highly selective ion channels that allow for transport of particular inorganic ions from the external environment into the neuron and/or from the interior of the neuron to the external environment. Particularly important inorganic ions include sodium, $Na^+$, potassium, $K^+$, calcium, $Ca^{2+}$, and chlorine, $Cl^-$, ions. The ion channels are generally not continuously open, but are selectively opened and closed in response to various types of stimuli. Voltage-gated channels open and close depending on the voltage, or electrical field, across the neuron membrane. Other channels are selectively opened and closed by mechanical stress, and still other types of channels open and close in response to binding and release of ligands, generally small-molecule organic compounds, including neurotransmitters. Ion-channel behavior and responses may additionally be controlled and modified by the addition and deletion of certain functional groups to and from ion-channel proteins, carried out by various enzymes, including kinases and phosphatases, that are, in turn, controlled by various types of chemical signal cascades.

In general, in a resting, or non-firing state, the neuron interior has a relatively low concentration of sodium ions 312, a correspondingly low concentration of chlorine ions 314, and a relatively high concentration of potassium ions 316 with respect to the concentrations of these ions in the external environment 318. In the resting state, there is a significant 40-50 mV electrochemical gradient across the neuron membrane, with the interior of the membrane electrically negative with respect to the exterior environment. The electrochemical gradient is primarily generated by an active $Na^+$—$K^+$ pumping channel 320 which uses chemical energy, in the form of adenosine triphosphate, to continuously exchange three sodium ions expelled from the interior of the neuron to the external environment for every two potassium ions imported from the external environment into the interior of the neuron. The neuron also contains passive $K^+$ leak channels 310 that allow potassium ions to leak back to the external environment from the interior of the neuron. This allows the potassium ions to reach equilibrium with respect to the ion-concentration gradient and the electrical gradient.

Neuron firing, or spiking, is triggered by a local depolarization of the neuron membrane. In other words, collapse of the normally negative electrochemical gradient across a membrane results in triggering of an output signal. A wavelike, global depolarization of the neuron membrane that represents neuron firing is facilitated by voltage-gated sodium channels 324 that allow sodium ions to enter the interior of the neuron down the electrochemical gradient previously established by the $Na^+$—$K^+$ pump channel 320. Neuron firing represents a short pulse of activity, following which the neuron returns to a pre-firing-like state, in which the normal, negative electrochemical gradient across the neuron membrane is reestablished. Voltage-gated potassium channels 326 open in response to membrane depolarization, V, to allow an efflux of potassium ions, down the chemical potassium-ion gradient, in order to facilitate reestablishment of an electrochemical gradient across the neuron membrane following firing. The voltage-gated potassium channels 324, opened by local depolarization of the neuron membrane, Y, are unstable, in the open state, and relatively quickly move to an inactivated state to allow the negative membrane potential to be reestablished, both by operation of the voltage-gated potassium channel 326 and the $Na^+$—$K^+$ channel/pump 320.

Neuron-membrane depolarization begins at a small, local region of the neuron cell membrane and sweeps, in a wave-like fashion, across the neuron cell, including down the axon to the axon terminal branches. Depolarization at the axon terminal branches triggers voltage-gated neurotransmitter release by exocytosis 328. Release of neurotransmitters by axon terminal branches into synaptic regions between the axon terminal branches of the firing neuron, referred to as the "pre-synaptic neuron," and dendrites of the signal-receiving neurons, each referred to as a "post-synaptic neuron," results in binding of the released neurotransmitter by receptors on dendrites of post-synaptic neurons that results in transmission of the signal from the pre-synaptic neuron to the post-synaptic neurons. In the post-synaptic neurons, binding of transmitters, T, to neurotransmitter-gated ion channels 330 and 332 results in excitatory input signals and inhibitory input signals, respectively. Neurotransmitter-gated ion channels that import sodium ions into the neuron 330 contribute to local depolarization of the neuron membrane adjacent to the synapse region, and thus provide an excitatory signal. By contrast, neurotransmitter-activated chlorine-ion channels 332 result in import of negatively charged chlorine ions into the neuron cell, resulting in restoring or strengthening the normal, resting negative voltage gradient across the membrane, and thus inhibit localized membrane depolarization and provide an inhibitory signal. Neurotransmitter release is also facilitated by voltage-gated calcium ion channels 329 that allow calcium influx into the neuron.

A $Ca^{2+}$ activated potassium channel 334 serves to decrease the depolarizability of the membrane following a high frequency of membrane depolarization and signal firing that results in build up of calcium ions within the neuron. A neuron that has been continuously stimulated for a prolonged period therefore becomes less responsive to the stimulus. Early potassium-ion channels serve to reduce neuron firing levels at stimulation levels close to the threshold stimulation required for neuron firing. This prevents an all-or-nothing type of neuron response about the threshold stimulation region, instead providing a range of frequencies of neuron firings that correspond to a range of simulations of the neuron. The amplitude of neuron firing is generally constant, with output-signal strength reflecting in the frequency of neuron firing.

Another interesting feature of the neuron is long-term potentiation. When a pre-synaptic neuron fires at a time when the membrane of a post-synaptic neuron is strongly depolarized, the post-synaptic neuron may become more responsive to subsequent signals from the pre-synaptic neuron. In other words, when pre-synaptic and post-synaptic neuron firings occur close in time, the strength, or weighting, of the interconnection may increase.

Figure 5:
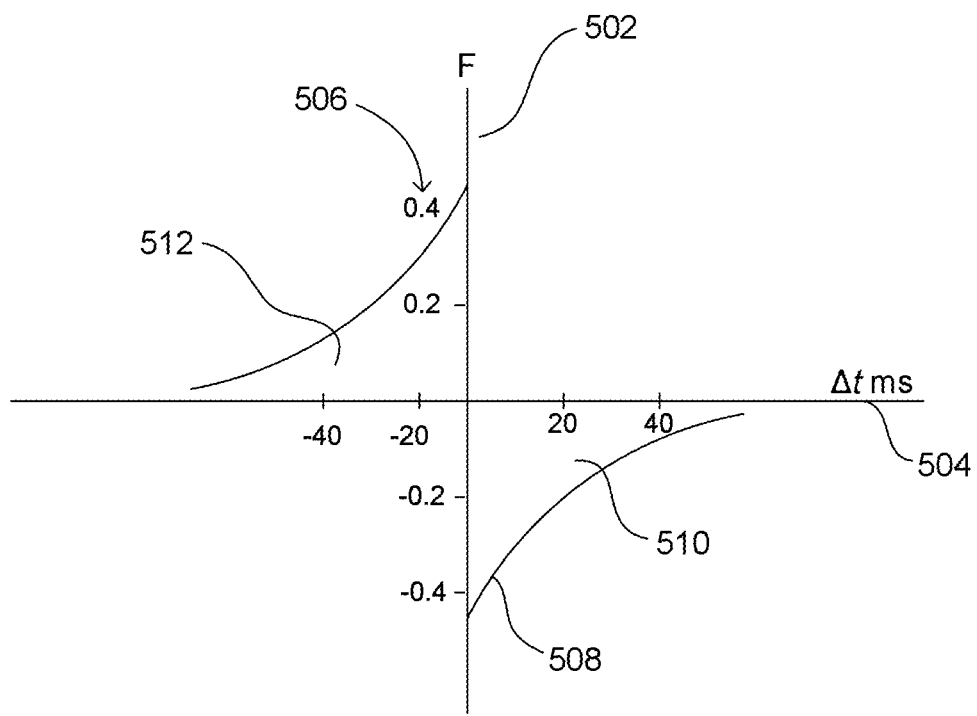
FIG. 5 shows a model for the dynamic synapse-strength phenomenon.

FIGS. 4A-B show neuron firing. In FIG. 4A, the resting-state neuron 402 exhibits a negative voltage gradient across a membrane 404. As the resting neuron receives neurotransmitter-mediated signal input 406, a small region 408 of the neuron membrane may receive sufficient access of stimulatory signal input over inhibitory signal input to depolarize the small region of the neuron membrane 408. This local depolarization activates the voltage-gated sodium channels to generate a wave-like global depolarization that spreads across the neuron membrane and down the axon, temporarily reversing the voltage gradient across the neuron membrane as sodium ions enter the neuron along the sodium-ion-concentration gradient. The reversal of the voltage gradient places the neuron into a firing 410, or spiking state, in which, as discussed above, terminal branches of the axon release neurotransmitter signals into synapses to signal post-synaptic neurons. The voltage-gated sodium channels quickly become inactivated, voltage-gated potassium channels open, and the resting-state negative voltage gradient is quickly restored 412. FIG. 4B shows the voltage gradient reversal at the point on the neuron membrane during a pulse or a firing. In general, the voltage gradient is negative 420, but temporarily reverses 422 during the wave-like membrane depolarization that represents neuron firing or spiking and propagation of the output signal down the axon to the terminal braches of the axon FIG. 5 shows a model for the dynamic synapse-strength phenomenon. FIG. 5 is a plot of synapse strengthening F, plotted with respect to the vertical axis 502, versus the time difference between pre-synaptic and post-synaptic spiking, plotted as $\Delta t$ along the horizontal axis 504. When the pre-synaptic neuron fires close in time, but prior to, firing of the post-synaptic neuron, the amount of synapse strengthening is relatively high, represented by the steeply increasing portion of the plotted curve 506 to the left of the vertical axis. This portion of the plot of F corresponds to Hebbian learning, in which correlations in the firing of post-synaptic and pre-synaptic neurons lead to synapse strengthening. By contrast, when the pre-synaptic neuron fires just after firing of the post-synaptic neuron, then the synaptic strength is weakened, as represented by the steeply upward curving portion 508 of the plotted curve to the right of the vertical axis. When firing of the pre-synaptic and post-synaptic neurons is not correlated in time, or, in other words, $\Delta t$ is large in magnitude, the strength of the synapse is not greatly affected, as represented by portions of the plotted curve that approach the horizontal axis at increasing distance from the origin. The synapse weakening response to pre-synaptic and post-synaptic neuron-firing correlations, represented by the area above the right-hand portion of the curve 510, needs to be greater than the synapse strengthening due to correlation between pre-synaptic and post-synaptic neuron firing, represented by the area under the left-hand portion of the plotted curve 512, in order for a system based on synapse strength to be stable, over time. Otherwise, synapse strength would tend towards maximum strength, over time.

In summary, neurons serve as somewhat leaky input-signal integrators combined with a thresholding function and an output-signal generation function. A neuron fires with increasing frequency as excitatory stimulation of the neuron increases, although, over time, the neuron response to constant high stimulus decreases. Synapses, or junctions, between neurons may be strengthened or weakened by correlations in pre-synaptic and post-synaptic neuron firings. In addition, and synapse strength and neuron stimulation both decay, over time, without reinforcing stimulus. Neurons provide a fundamental computational unit for massively parallel neuronal networks within biological organisms as a result of the extremely high density of connections between neurons supported by the highly branched dendrites and axon terminus branches, as well as by the length of axons.

II. An Overview of Instar and Outstar Synaptic Models

Instar and Outstar synaptic models are now described with reference to a single source neuron and single sink neuron. Note, however, that for the sake of convenience the single source and sink neurons used to describe Instar and Outstar synaptic models actually represent at least one source neuron and at least one sink neuron.

Figure 6A:
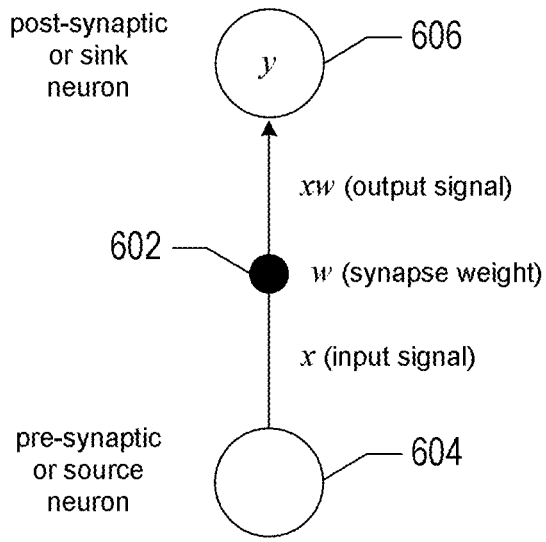
FIGS. 6A-6B show schematic representations of an example Instar and Outstar synapses.

FIG. 6A shows a schematic representation of an Instar synapse 602 that connects a source neuron 604 to a sink neuron 606. The source 604 emits an analog source signal, x, which is scaled by the synapse's 606 "weight," w, before being delivered to the sink. In other words, the state of the Instar synapse 606 is characterized by a weight, w, that transforms the source signal x generated by the source neuron 604 into an output signal xw that is delivered to the sink neuron 606. This transformation of the source signal x into the output signal xw is called the "synaptic transfer function" and is defined as follows:

$$\text{out} = xw \qquad \text{Equation (1):}$$

On the other hand, the sink neuron 606 also produces an analog sink signal, y, that characterizes interaction with the input signal x and is used to determine the state evolution of the synaptic weight w. The signal y is feedback from the sink neuron 606. In other words, the sink neuron 606 receives and processes the out signal and responds to out signal by generating feedback signal y. The state of the sink signal y partially depends upon the history of incoming signals received from synapses that drive it. Values for the source signal x, sink signal y, and synaptic weight w are constrained to the interval [0,1]. The sink signal y and the source signal x can be used to determine the state evolution of the synaptic weight w by mathematically representing the state evolution of the Instar synapse 602 by a first-order differential equation:

$$\frac{dw}{dt} = \varepsilon y(x - w) \qquad \text{Equation (2)}$$

where $\varepsilon$ is a positive constant called the "learning rate," and dw/dt is called the "state evolution."

Figure 6B:
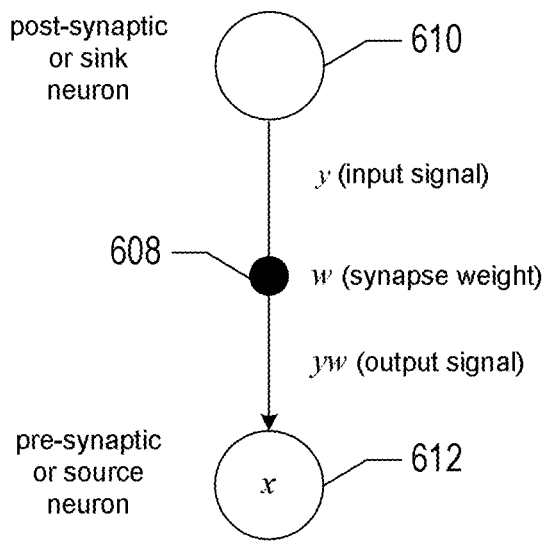

FIG. 6B shows a schematic representation of an Outstar synapse 608 that connects a sink neuron 610 to a source neuron 612. In an analogous manner to the Instar synapse described above, the state evolution of the Outstar synapse 608 can also be mathematically characterized by a first-order differential equation:

$$\frac{dw}{dt} = \varepsilon x(y - w)$$

An electronic implementation of an Instar synapse using conventional electronic components can be difficult to implement because of the time scale at which learning takes place (i.e., seconds or longer). A typical analog implementation of the differential equation (2) requires a capacitor for storing the state w along with various operational amplifiers and multipliers. Although circuit design of a conventional electronic implementation of the Instar synapse may reduce the area required for such a circuit, unavoidable leakage across at the capacitor which introduces a decay term into equation (2), which perturbs the desired behavior and is difficult to mitigate. At the network level, such decay appears as memory loss or drift.

Typical neural network models use differential equations to describe average behavior of neuron populations, even though the majority of a neuron's communications are performed using discrete "pulses." Systems and methods implement a stochastic approximation of Instar and Outstar synapses using synchronous, spiking neurons in order to implement the signals x and y, and binary switches that implement the synaptic weight w assembled as a population of components. Systems implement the weights with binary devices and neurons communicate with discrete electrical pulses rather than analog voltages. In particular, the binary synapses can be implemented with memristive nanoscale devices. Systems of the present invention use less surface area and require less power than either software or conventional electronic implementations and may enable the construction of neuromorphic integrated circuits that approach biological scale density and power.

III. An Instar Model

Figures 7, 8:
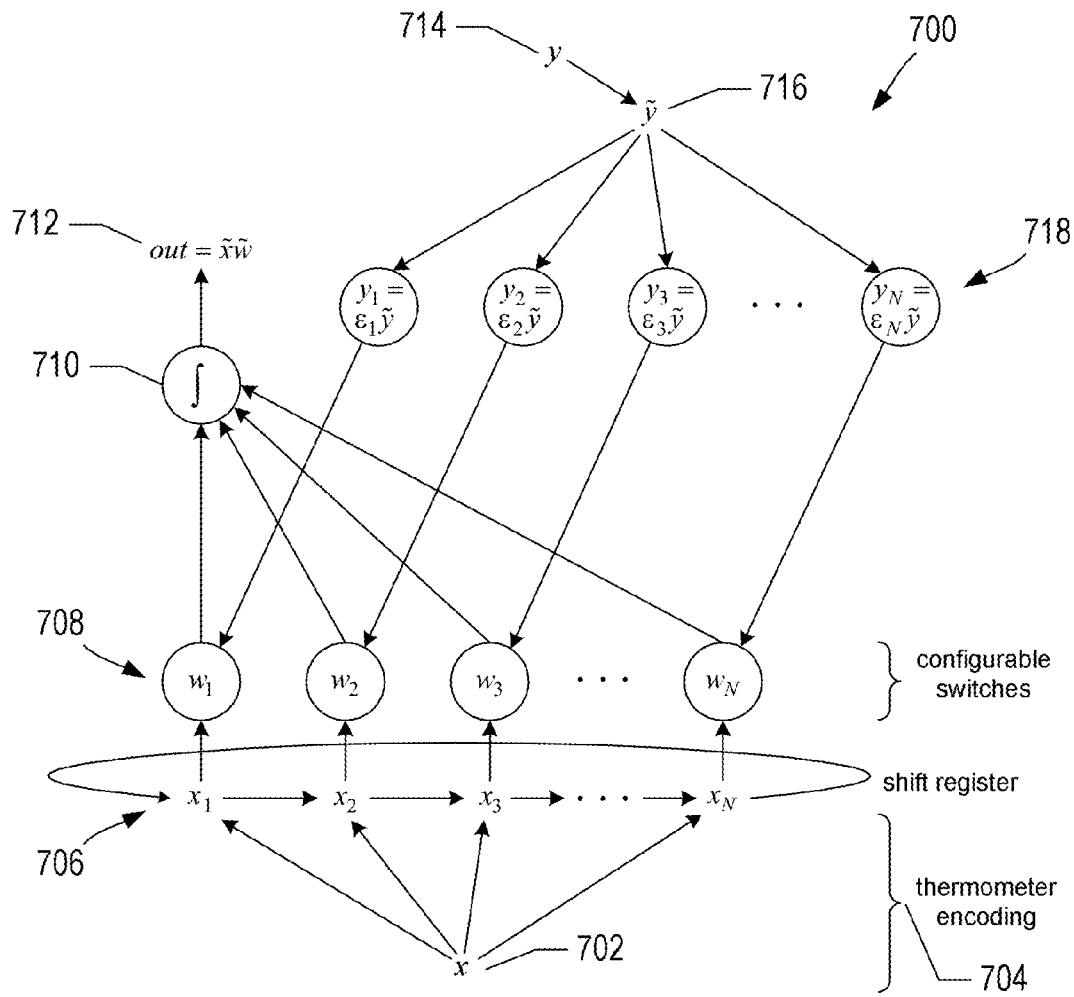
FIG. 7 shows a schematic representation of an example Instar model.
FIG. 8 shows a table representing an example of thermometer encoding.

FIG. 7 shows a schematic representation of an Instar model 700 for transforming an analog input signal x into an output signal out. The Instar model 700 interleaves computation of the transfer function out and the time evolution of the synaptic weight w. Analog source signal x 702 is a continuous input transformed into a discrete N-bit codeword represented by ($x_1, x_2, x_3, \ldots, x_N$) using thermometer encoding 704, which is described below with reference to FIG. 8. Each $x_i$ corresponds to a "pulse" or a discrete high or a low electrical signal. For example, an $x_i$ assigned the bit "1" may correspond to a discrete high voltage, and an $x_i$ assigned the bit "0" may correspond to a discrete low voltage. In one example, thermometer encoding can be performed by assigning the first M bits of an N-bit codeword the bit value "1," and assigning the remaining bits the bit value "0," where M is roughly proportional to the analog input value. Thermometer encoding 704 can be accomplished using the following operator represented by:

$$M = \lfloor x(N+1) \rfloor$$

where $\lfloor \Box \rfloor$ is an operator that selects the largest integer less than or equal to x (N+1). The value chosen for N determines the precision of the discrete approximation of the analog value x. An auxiliary continuous variable $\tilde{x}$ is defined as the average of the bit values of the N-bit codeword as follows:

$$\tilde{x} \equiv \frac{1}{N}\sum_i x_i$$

where $\tilde{x} \cong x$.

FIG. 8 shows a table 800 representing an example of thermometer encoding using the above operator where N equals "4." In other words, a source signal is converted into a 4-bit codeword represented by $(x_1, x_2, x_3, x_4)$. With reference to the table 800, examples of two different input source signals x 802 and 804 are now described. For source signal x equal to 0.15 (802), none of the bits in the 4-bit codeword are "1" because $M = \lfloor 0.15(5) \rfloor = \lfloor 0.75 \rfloor = 0$. In other words, the 4-bit codeword produced by thermometer encoding is "0000" (803). For source signal x equal to 0.79 (804), $M = \lfloor 0.79(5) \rfloor = \lfloor 3.95 \rfloor = 3$. In other words, the first three bits of the 4-bit codeword produced by thermometer encoding are "1" and the corresponding 4-bit codeword is "1110" (805).

Returning to FIG. 7, the bits of the N-bit codeword $(x_1, x_2, x_3, \ldots, x_N)$ are parallel loaded into a circular shift register 706. The weight w is implemented with N configurable switches 708, where each configurable switch applies a weight $w_i$ to a bit $x_i$ of the N-bit codeword. The weight applied by each switch is characterized as a binary variable. An auxiliary value $\tilde{w}$ is defined as the average of the N binary variables $w_i$ as follows:

$$\tilde{w} \equiv \frac{1}{N}\sum_{i=1}^{N} w_i$$

where $\tilde{w} \cong w$. As shown in FIG. 7, each bit $x_i$ stored in the circular shift register 706 is sent through a corresponding configurable switch with weight $w_i$. The circular shift register 706 is cycled N times in order to send N "pulses" or bits $x_i$'s through each of the binary switches, $w_i$, where the weighted pulses, $w_i x_i$, are accumulated 710 to generate the output signal out 712. In other words, for each of the N cycles, the circular shift register 706 shifts the bits of the N-bit codeword such that the binary value of $x_i$ becomes the binary value of $x_{i+1}$ and the binary value of $x_N$ becomes the binary value of $x_i$. Each bit $x_i$ is then sent through a corresponding configurable switch that applies a weight $w_i$ resulting in $w_i x_i$ and the values $w_i x_i$ are accumulated to generate the output signal out 712. After N cycles, the output signal 712 is given by:

$$\text{out} = \tilde{x}\tilde{w}.$$

Figure 9:
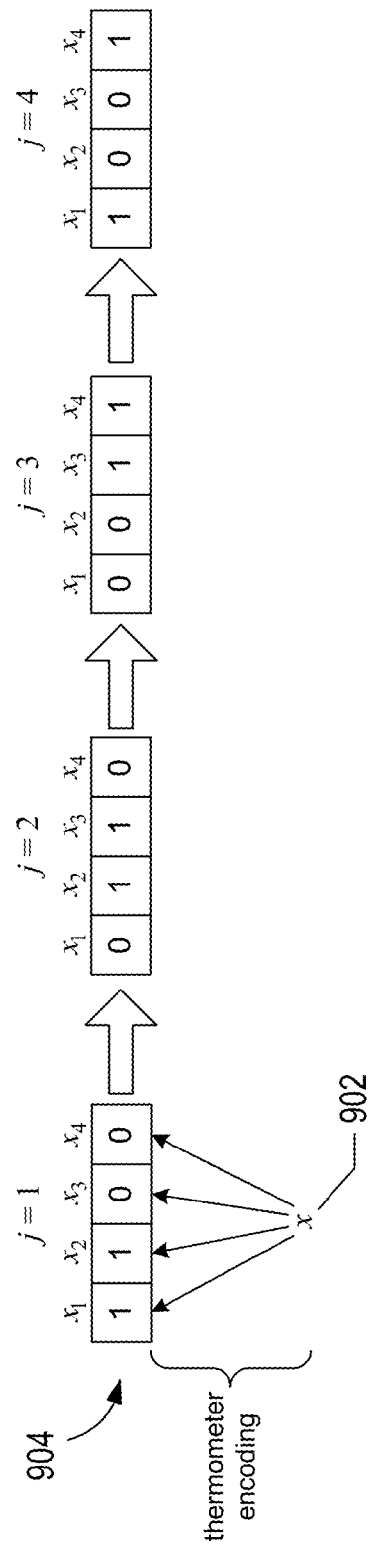
FIG. 9 shows example operation of a circular shift register.

FIG. 9 shows operation of the circular shift register 706 for an example 4-bit codeword. Thermometer encoding 704 is applied to the input signal x 902 to produce the 4-bit codeword "1100," which is input and stored in the circular shift register 706. The number of cycles carried out by the circular shift register is 4 (i.e., N=4). For the first cycle j equal to 1, each bit $x_i$ or pulse is sent through a corresponding switch $w_i$ and the resulting weighted values $w_i x_i$ are accumulated 710. For the second cycle j equal to 2, as shown in FIG. 9, the bits associated with the 4-bit codeword $(x_1, x_2, x_3, x_4)$ are circularly shifted such that the bit of $x_1$ becomes the bit of $x_2$, the bit of $x_2$ becomes the bit of $x_3$, the bit of $x_3$ becomes the bit of $x_4$, and the bit of $x_4$ becomes the bit of $x_1$. Each bit $x_i$ or pulse is sent through a corresponding switch $w_i$ and the weighted values are accumulated 710. For the third cycle j equal to 3, the bits associated with $(x_1, x_2, x_3, x_4)$ are again shifted again in the same manner, the pulses associated with the bits are sent through corresponding switches, and the weighted values are accumulated 710. For the fourth cycle j equal to 4, the bits associated with $(x_1, x_2, x_3, x_4)$ are shifted for a final time in the same manner, each bit is sent through a corresponding switch, and the weighted values are accumulated 710. When the four cycles are completed, the output signal out is produced.

Returning to FIG. 7, after the completion of the N cycles, a synaptic state update of the weights, also called "learning", is performed. The analog sink signal y 714 is replaced with a stochastic binary value denoted by $\tilde{y}$ 716 that pulses at a rate proportional to the value of the sink signal y. For example, a y value of 0.25 corresponds to a stochastic $\tilde{y}$ that randomly pulses (i.e., assumes the bit value "1") on average, 25% of the time. In other words, $\tilde{y}$ equals "1" with probability y, and $\tilde{y}$ equals "0" with probability (1−y). Independent stochastic binary variables $\epsilon_1, \epsilon_2, \epsilon_3, \ldots, \epsilon_N$ each take on the bit value "1" with fixed probability $\epsilon$, where $\epsilon$ is an application specific design parameter with a selected value that is typically smaller than 0.001 The independent stochastic binary variables define N auxiliary variables $y_1, y_2, y_3, \ldots, y_N$ defined as:

$$y_i = \epsilon_i \tilde{y}$$

Each of the N auxiliary variables $y_1, y_2, y_3, \ldots, y_N$ 718 determines the state evolution of the weight of a corresponding switch, as described below. In other words, at the end of N cycles, N auxiliary variables $y_1, y_2, y_3, \ldots, y_N$ are generated and used to change, or update, the weights $w_1, w_2, w_3, \ldots, w_N$, respectively, associated with each configurable switch. The N cycles and updating the weights of the switches is called a "major cycle."

Next, evaluation of the transfer function is described and is shown to approximate Equation (1). Subsequently the circuit operations that implement synaptic weight update are described, and it is shown that the circuit stochastically approximates the time evolution of equation (2). Finally, a circuit implementation for the schematic representation shown in FIG. 7 is described.

III.A. Evaluating the Transfer Function

The schematic representation of FIG. 7 is implemented sequentially. At the beginning of a major cycle, a source signal x is input. As described above, each major cycle is performed N+1 times. The first N cycles carry out evaluation of the transfer function to produce the output signal out. At the conclusion of the first N cycles, an approximation of the desired output signal out is generated 712. The final (N+1)th cycle performs a synaptic weight update.

Figure 10:
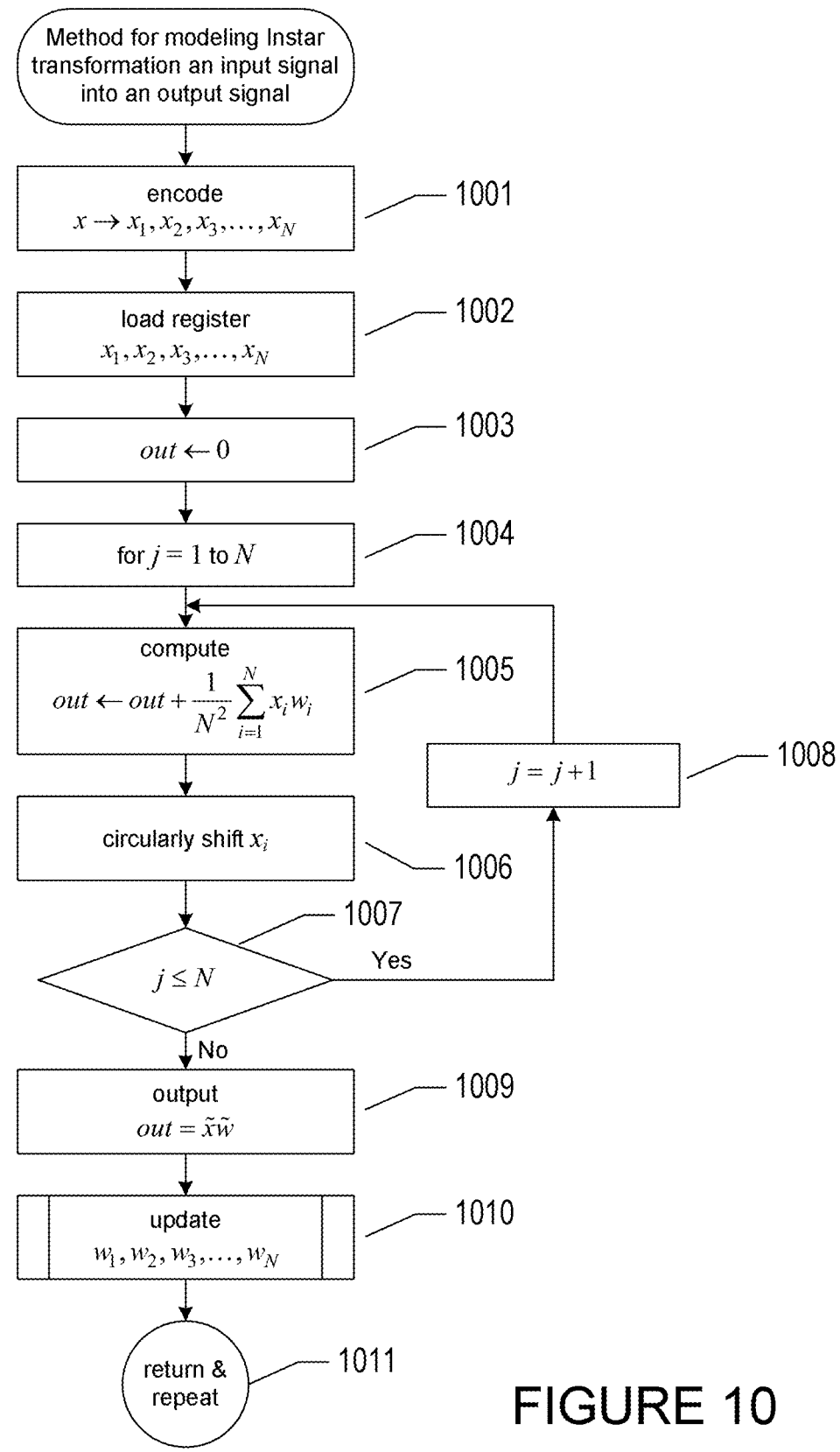
FIG. 10 shows a control-flow diagram of an example method for transforming an analog input signal into an output signal.

FIG. 10 shows a control-flow diagram of a method for performing Instar neuron learning. In block 1001, the analog source signal x is encoded to produce an N-bit codeword $(x_1, x_2, x_3, \ldots, x_N)$. The source signal x can be encoded using thermometer encoding 704 as described above with reference to FIG. 8. In block 1002, the N-bit codeword $(x_1, x_2, x_3, \ldots, x_N)$ is parallel loaded into a circular shift register, such as the circular shift register 706 shown in FIG. 7. In block 1003, the output state out is initialized to "0." In the for-loop of block 1004, blocks 1005-1007 are repeated N times. In block 1005, the weighted values $w_1 x_i$ output from each switch are accumulated as follows:

$$out \leftarrow out + \frac{1}{N^2}\sum_{i=1}^{N} x_i w_i$$

In block 1006, the binary values of the N-bit codeword are circularly shifted as described above with reference to the example of FIG. 9. In block 1007, when the index j is less than N, the method proceeds to block 1008. Otherwise, the method proceeds to block 1009. In block 1008, the index j is incremented. In block 1009, the output signal out is output. In block 1010, the weight $w_i$ associated with each switch, as described below with reference the control-flow diagram in FIG. 11 titled "Method for synaptic state evolution." In block 1011, blocks 1001-1010 can be repeated for another major cycle.

The method shown in FIG. 10 can be shown to approximate the Instar transfer function as follows. First note that in the for-loop of blocks 1004-1008, the value of the output signal can be represented as follows:

$$out = \frac{1}{N^2}\sum_{j=0}^{N-1}\sum_{i=1}^{N} x_{(i+j)modN} w_i$$

Rearranging terms gives the result:

$$out = \frac{1}{N}\sum_{i=1}^{N} w_i \frac{1}{N}\sum_{j=0}^{N-1} x_{(i+j)modN}$$

The rightmost summation is a summing over all of the bits in the N-bit codeword $(x_1, x_2, \ldots, x_N)$, which yields the same result for any value of i, enabling the equation to be simplified as follows:

$$out = \frac{1}{N}\sum_{i=1}^{N} w_i \frac{1}{N}\sum_{j=1}^{N} x_j$$
$$= \frac{1}{N}\sum_{i=1}^{N} w_i \tilde{x}$$
$$= \tilde{w}\tilde{x}$$
$$\approx wx$$

III.B Synaptic State Learning

Figure 11:
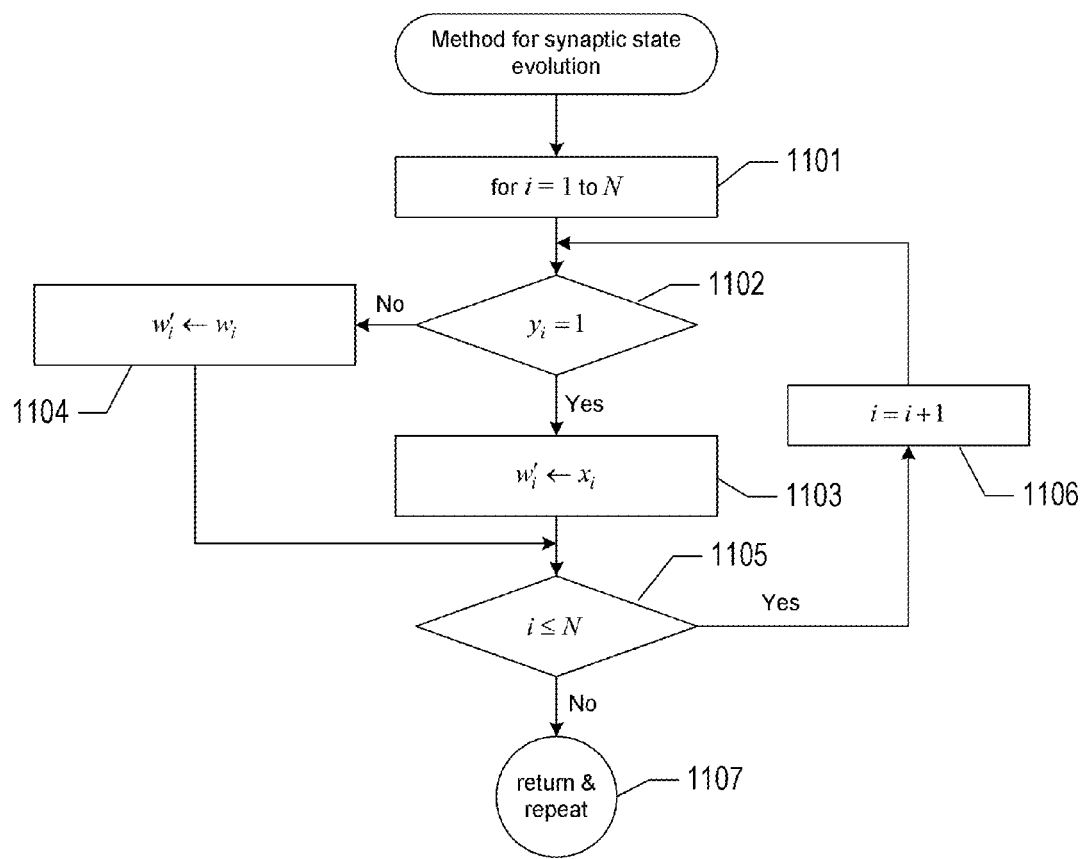
FIG. 11 shows a control-flow diagram of an example method for synaptic weight learning.

Synaptic state update, or learning, as referenced above in block 1010 of FIG. 10 is performed only during the final sub-cycle of a major cycle. FIG. 11 shows a control-flow diagram of a method for synaptic state evolution. The method of FIG. 11 describes a learning law for the state evolution of each binary weight variable $w_i$ from its current state, $w_i$, to its next state, $w'_i$, of the subsequent major cycle. The for-loop of block 1101 repeats blocks 1102-1106 for each cycle. In block 1102, when $y_i$ equals the binary value "1," the method proceeds to block 1103; otherwise, the method proceeds to block 1104. In block 1103, the binary value assigned to the weight of the next major cycle $w'_i$ is binary value of the bit $x_i$. In block 1104, the binary value assigned to weight of the next major cycle $w'_i$ is the binary value of the weight from the previous major cycle $w_i$. In block 1105, when i is less than N, the method proceeds to block 1106; otherwise the method proceeds to block 1107. In block 1106, the index i is incremented. In block 1107, the method returns to the method described above with reference to FIG. 10.

An implementation of the learning law described in FIG. 11 is described in the subsequent subsection IV. Note that when $y_i=1$, $$\Delta w_i = x_i - w_i$$

Consider the evaluating all possible scenarios of the learning law as presented in Table 1:

TABLE 1

| $x_i$ | $w_i$ | $w'_i$ | $\Delta w_i$ |
|---|---|---|---|
| 0 | 0 | 0 | 0 |
| 0 | 1 | 0 | −1 |
| 1 | 0 | 1 | 1 |
| 1 | 1 | 1 | 0 |

Consider first the case where y is fixed at 1.0, implying that $\tilde{y}$ equals 1. By substitution of $\Delta w_i$ and using the assumption that the associated $\epsilon_i$ stochastic variables are independent, the expectation value of the change in $\tilde{w}$ given $\tilde{y}=1$ is:

$$E(\Delta\tilde{w}\mid\tilde{y}=1) = \frac{1}{N}\sum_{i=1}^{N}\varepsilon_i(x_i - w_i)$$
$$= \frac{1}{N}\sum_{i=1}^{N}\varepsilon_i x_i - \frac{1}{N}\sum_{i=1}^{N}\varepsilon_i w_i$$
$$\cong \varepsilon\left(\frac{1}{N}\sum_{i=1}^{N} x_i - \frac{1}{N}\sum_{i=1}^{N} w_i\right)$$
$$= \varepsilon(\tilde{x} - \tilde{w})$$

If $\tilde{y}$ equals "0," the weights do not change by definition of the learning law, thus $$E(\Delta\tilde{w}\mid\tilde{y}=0)=0$$

Because $\tilde{y}$ equals "1" with probability y, and is equal to "0" with probability (1−y), the average change in $\tilde{w}$ is given by:

$$E(\Delta\tilde{w}) = yE(\Delta\tilde{w}\mid\tilde{y}=1) + (1-y)E(\Delta\tilde{w}\mid\tilde{y}\neq 1)$$
$$= \varepsilon y(\tilde{x} - \tilde{w})$$
$$\approx \varepsilon y(x - w)$$

which is the Instar learning law, the desired behavior for the circuit.

IV. Implementation

Figure 12:
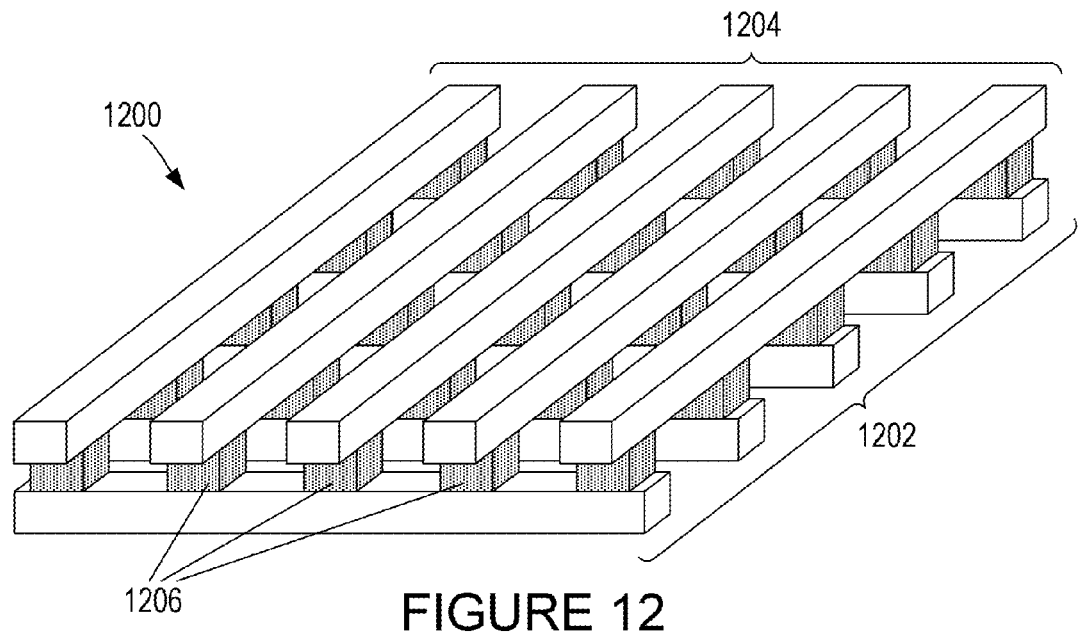
FIG. 12 shows an isometric view of an example of a crossbar array.

Conventional analog and digital circuitry can be used to implement Instar and Outstar learning models with memristive devices, or memristors, used as two-terminal switches. For example, the Instar model 700 can be implemented at the nanoscale or microscale using a crossbar array with memristor crossbar junctions. FIG. 12 shows an isometric view of a crossbar array 1200. The crossbar array 1200 is composed of a first layer of approximately parallel nanowires 1202 that are overlain by a second layer of approximately parallel nanowires 1204. The nanowires of the second layer 1204 are approximately perpendicular, in orientation, to the nanowires of the first layer 1202, although the orientation angle between the layers may vary. The two layers of nanowires form a lattice, or crossbar, each nanowire of the second layer 1204 overlying all of the nanowires of the first layer 1202 and coming into close contact with each nanowire of the first layer 1202 at nanowire intersections that represent the closest contact between two nanowires. Although individual nanowires in FIG. 12 are shown with rectangular cross sections, nanowires can also have square, circular, elliptical, or more complex cross sections. The nanowires may also have many different widths or diameters and aspect ratios or eccentricities. The term "crossbar" may refer to crossbars having at least one layer of nanowires, sub-microscale wires, microscale wires, or wires with larger dimensions.

The layers of a crossbar array can be fabricated by mechanical nanoimprinting techniques. Alternatively, nanowires can be chemically synthesized and can be deposited as layers of approximately parallel nanowires in at least one processing step, including Langmuir-Blodgett processes. Other alternative techniques for fabricating wires may also be employed. Thus, a two-layer crossbar comprising first and second layers, as shown in FIG. 12, can be manufactured by any of numerous relatively straightforward processes. Many different types of conductive and semi-conductive nanowires can be chemically synthesized from metallic and semiconductor substances, from combinations of these types of substances, and from other types of substances. A nanowire crossbar may be connected to microscale address-wire leads or other electronic leads, through a variety of different methods in order to incorporate the nanowires into electrical circuits.

At each nanowire intersection, an electronic component, such as a nanoscale memristor, or analogous electronic component, can be fabricated to interconnect two overlapping nanowires to form a switch. For example, as shown in FIG. 12, memristors 1206 located at each of the crossbar intersections form switches.

Figure 13A:
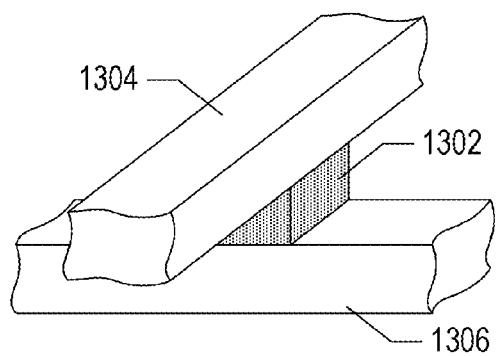
FIGS. 13A-13C show memristive characteristics of a crossbar junction.
Figure 13B:
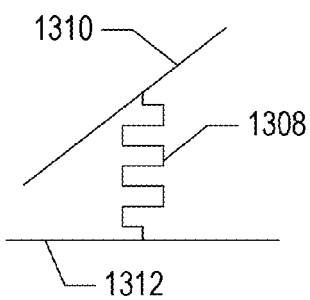
Figure 13C:
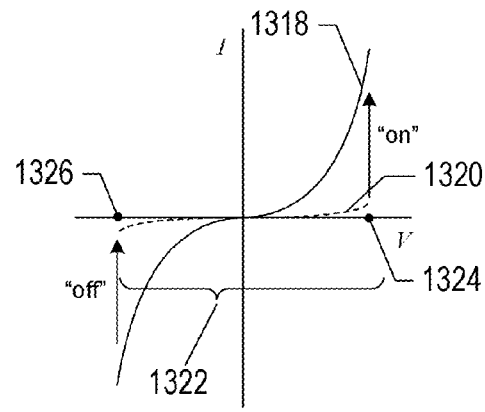

Memristors can be used as resistive analog memories that are capable of storing state information with very little decay for long periods of time, such as days, weeks, months, and possibly years. In certain examples, a single bit can be stored in each memristor using the high-resistance state of the memristor to represent a logic "0" bit value, and the low-resistance state to represent a logic "1" bit value. FIGS. 13A-13C show the memristive characteristics of cross junctions that can be fabricated by currently available techniques. FIG. 13A illustrates a single crossbar junction. The crossbar junction comprises memristive material 1302 at the junction between a first, input nanowire 1304 and a second, output nanowire 1306. FIG. 13B shows a circuit symbol 1308 that represents the memristor 1302 and lines 1310 and 1312 that represent the nanowires 1304 and 1306, respectively. FIG. 13C shows a plot of current I versus voltage V for a typical memristor located at a nanoscale crossbar junction. Solid curve 1318 shows a plot of the current of the memristor in a low-resistance state, and dashed nonlinear curve 1320 represents the memristor in a high-resistance state. Low voltages within the voltage interval 1322 have negligible affect on the resistive state of the memristor, while larger voltages can change the memristor's resistance state. A positive voltage exceeding the positive "on" threshold 1324 causes the memristor to switch into the low-resistance state 1318, while a negative voltage less than the negative "off" threshold 1326 causes the memristor to switch into the high-resistive state 1320.

Figure 14A:
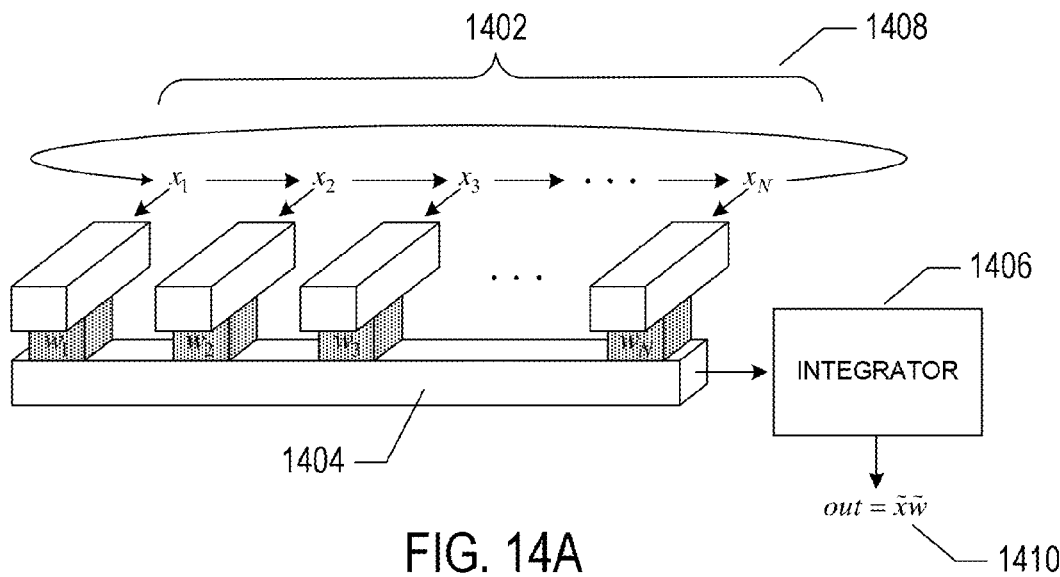
FIG. 14A shows a row of configurable switches of a nanowire crossbar for implementing the Instar model, shown in FIG. 7.

FIG. 14A shows a row of N-configurable switches $w_1, \ldots, w_N$ of a nanowire crossbar for implementing the Instar model 700. As described above with reference to FIG. 7, the Instar model 700 transforms an analog input signal x into an output signal out. Each of the N-configurable switches $w_1, \ldots, w_N$ electronically connects a nanowire of a first layer of N nanowires 1402 to a single nanowire 1404 in a second layer of nanowires. The nanowire 1404 is electronically connected to an integrator 1406. As shown in the example of FIG. 14A, each bit $x_i$ stored in circular shift register 1408 is sent through a corresponding nanowire in the first layer of nanowire 1402 to a configurable switch with weight $w_i$. As described above with reference to FIG. 7, the circular shift register 1408 is cycled N times in order to send N "pulses" or bits $x_i$'s through each of the binary switches $w_i$, where the weighted pulses $w_i x_i$ are accumulated by the integrator 1406 to generate the output signal out 1410. In other words, for each of the N cycles, the circular shift register 1408 shifts the bits of the N-bit codeword such that the binary value of $x_i$ becomes the binary value of $x_{i+1}$ and the binary value of $x_N$ becomes the binary value of $x_1$. Each bit $x_i$ is then sent through a corresponding configurable switch that applies a weight $w_i$ resulting in a weighted bit $w_i x_i$ and the values $w_i x_i$ are accumulated by the integrator 1406 to generate the output signal out 1410. After N cycles, the output signal 1410 given by $$\text{out} = \vec{x}\vec{w}$$

is produced.

Figure 14B:
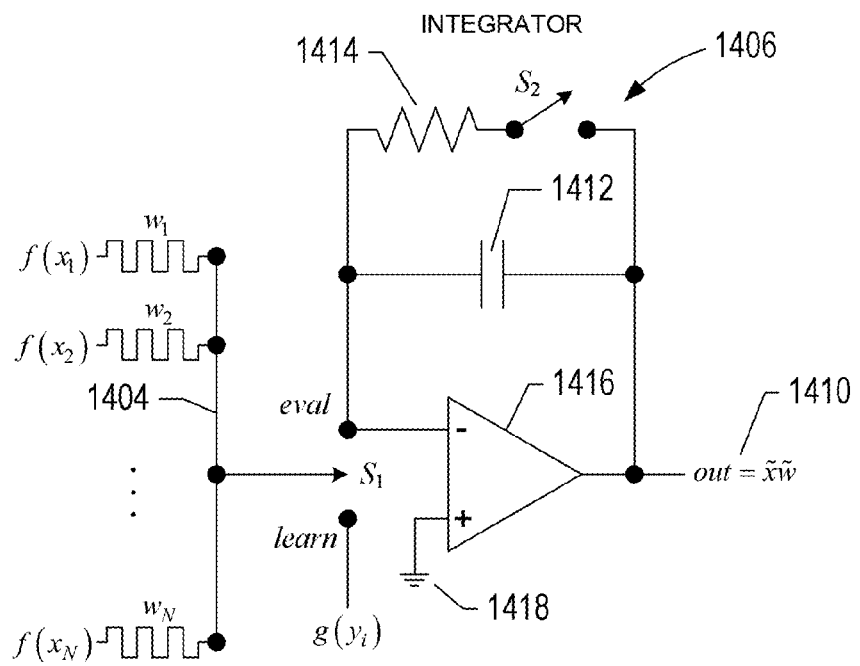
FIG. 14B shows an example schematic circuit diagram of the configurable switches shown in FIG. 14A.

FIG. 14B shows a schematic circuit diagram of the N-configurable switches $w_1, \ldots, w_N$ and integrator 1406 shown in FIG. 14A. The integrator 1406 includes a capacitor 1412, a resistor 1414, a first switch $S_1$, a second switch $S_2$, and a differential amplifier 1416. During evaluation of the transfer function $f$ or each of the first N cycles of a major cycle, for each switch $w_i$ the switch $S_1$ is closed to the eval position and $S_2$ is closed. In FIG. 14B, each function $f(x_i)$ represents sending a narrow pulse or voltage to a corresponding memristor $w_i$ when $x_i$ equals the logic "1" bit value, and sends no pulse (i.e., approximately no or a low voltage) when $x_i$ equals the logic "0" bit value. These pulses are integrated by the integrator 1406 to compute the variable output signal out 1410. On the other hand, during learning or state evolution, which occurs as the last action of a major cycle, switch $S_1$ is closed to the learn position and signals $f(x_i)$ and $g(y_i)$ collaborate to implement the state change of $w_i$ shown in Table 1. $S_2$ is also closed during learning in order to discharge the capacitor 1412, resetting the out variable to 0. Each memristor is terminated to a virtual ground 1418 on the integrator 1406. If a non-zero pulse $f(x_i)$ is sent, the current through the corresponding memristor is equal to the amplitude of the pulse times the conductance of the switch, or weight $w_i$. These pulse currents are collected and summed by the integrator 1406 at the capacitor 1412. During the N evaluation cycles, the circulating shift register holds each of the $x_i$ bits in turn so that upon completion, the integrated voltage on the capacitor 1412 is proportional to $$\sum_{i=1}^{N} x_i,$$

$w_i$, which is the desired transfer function.

Figure 15:
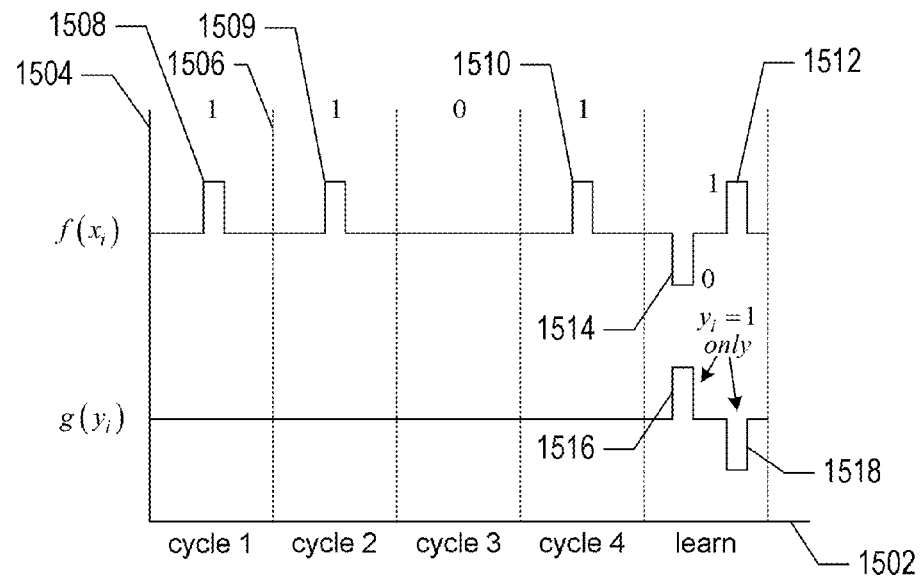
FIG. 15 shows an example timing diagram associated with a switch.

FIG. 15 shows an example timing diagram associated with a switch operated with a 4-bit codeword. Axis 1502 represents time, and perpendicular axis 1504 represents voltage for the signals $f(x_i)$ and $g(y_i)$. Cycles 1-4 are separated by dashed lines, such as dashed line 1506. In cycle 1, 2, and 4, nonzero pulses θ($x_i$) 1508-1510 are sent from the circular shift register when the logic bit value $x_i$ is "1," and no pulse is sent during cycle 3 when the logic bit value $x_i$ is "0" and the pulses are integrated by the summing circuit shown in FIG. 14. The final part of the major cycle, is learning where the value of $x_i$ during cycle 1 has returned in the circular shift register to its original logic bit value. During learning, $f(x_i)$ sends a positive pulse 1512 in the second half of the learning phase if $x_i$ equals the logic bit value "1," or $f(x_i)$ sends a negative pulse 1514 in the first half of the learning phase if $x_i$ equals 0. In the example shown in FIG. 15, only the positive pulse 1512 would be sent because $x_i$ equals logic bit value "1" during cycle 1. The $g(y_i)$ signal sends pulses 1516 and 1518 only when $y_i$ equals 1, and the pulse align in time with the positive or negative pulse sent by $f(x_i)$.

The pulses sent by $f(x_i)$ and $g(y_i)$ are approximately aligned in time. Each pulse has an amplitude V which is below the switching threshold of the memristor. In other words, if a single $f(x_i)$ pulse arrives at a memristor without a corresponding aligned $g(y_i)$, neither pulse alters the resistance state of the memristor. But when $f(x_i)$ and $g(y_i)$ pulses are aligned in time, the net voltage drop across the memristor exceeds the switching threshold of the memristor, potentially changing the resistance state, as described above with reference to FIG. 13C. In summary, with reference to FIGS. 13C and 15, there are three cases to consider for changing the weight $w_i$ of a switch:

1. $y_i=0$. In this case, $g(y_i)$ does not generate any pulses, so the resistance state of the memristor does not change. In other words, $w_i$ is not changed.

2. $y_i=1$ and $x_i=0$. In this case, $g(y_i)$ generates positive and negative pulses 1516 and 1518, as shown in FIG. 15, while $f(x_i)$ generates only the negative pulse 1514 that aligns with the positive $g(y_i)$ pulse 1516. The net voltage drop across the memristor is negative and exceeds the "off" threshold 1324 required to drive the device into the low-conductance state 1320. In other words, $w_i$ equals logic bit value "0."

3. $y_i=1$ and $x_i=1$. Again $g(y_i)$ generates positive and negative pulses 1516 and 1518 while $f(x_i)$ generates only the positive pulse 1512 that aligns with the negative pulse 1518. The net voltage drop across the memristor is positive and exceeds the "on" threshold 1322 and drives the memristor into the closed, high-conductance state 1318. In other words, $w_i$ equals logic bit value "1."

Figure 16:
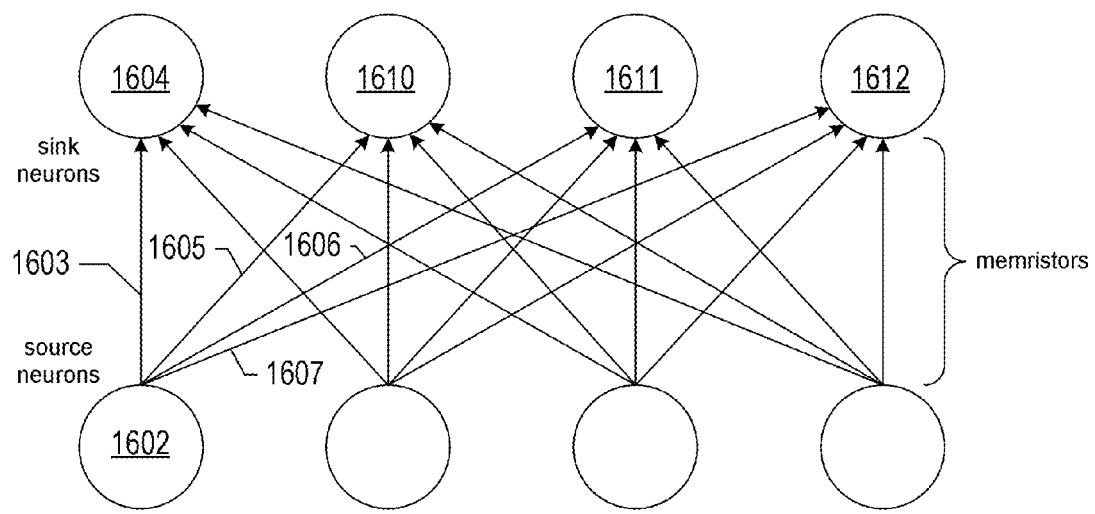
FIG. 16 shows an example of four source neurons sharing the same circuitry to communicate with four sink neurons.

In certain systems, all of the circuitry except for the memristive switches can be shared by a large number of synapses. Since neurons typically have a high fan-in and high fan-out, the cost of the analog and digital circuitry can be amortized over a very large number of implemented synapses. FIG. 16 shows an example of four source neurons that share the same circuitry to communicate with four sink neurons. For example, the circuitry used by source neuron 1602 to send source signals 1603 to sink neuron 1604 can be used by source neuron 1602 to send source signals 1605-1607 to sink neurons 1610-1612, respectively.

V. An Outstar Model

Figure 17:
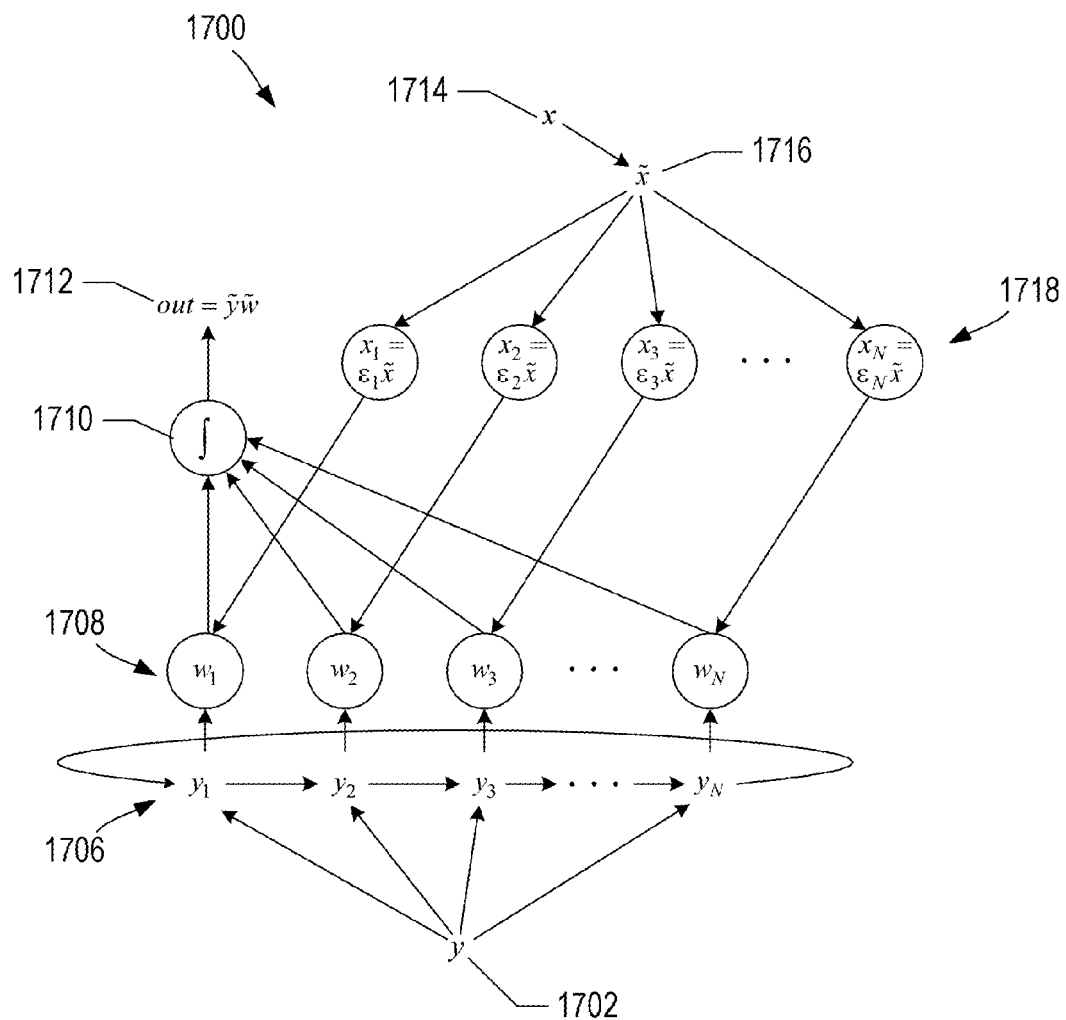
FIG. 17 shows a schematic representation of an example of Outstar model learning.

The Outstar learning law has the same transfer function as the Instar model, and a state evolution equation that interchanges the roles of the singles x and y as described above with reference to FIG. 6B. FIG. 17 shows an example schematic representation of an Outstar model 1700. The Outstar model 1700 interleaves computation of the transfer function out and the time evolution of the synaptic weight w. Analog sink signal y 1702 is a continuous input transformed into a discrete N-bit codeword represented by ($y_1, y_2, y_3, \ldots, y_N$) using thermometer encoding, as described above with reference to FIGS. 7 and 8. An auxiliary continuous variable z is defined as the average of the bit values of the N-bit codeword as follows:

$$\tilde{y} \equiv \frac{1}{N}\sum_i y_i$$

where $\tilde{y} \approx y$. The bits of the N-bit codeword ($y_1, y_2, y_3, \ldots, y_N$) are parallel loaded into a circular shift register 1706. The weight w is implemented with N configurable switches 1708, where each configurable switch applies a weight $w_i$ 1708 to a bit $y_i$ of the N-bit codeword. The weight applied by each switch is characterized as a binary variable, as described above with reference to FIG. 7. Each bit $y_i$ stored in circular shift register 1706 is sent through a corresponding configurable switch with weight $w_i$. The circular shift register 1706 is cycled N times in order to send N "pulses" or bits $y_i$'s through each of the binary switches, where the weighted pulses, $w_i y_i$, are accumulated 1710 to generate the output signal out 1712, as described above with reference to FIG. 7. After N cycles, the output signal 1712 is given by:

$$\text{out} = \tilde{x}\tilde{w}$$

After the completion of the N cycles, a synaptic state update or learning of the weights is performed. The analog source signal x 1714 is replaced with a stochastic binary value denoted by z 1716 that pulses at a rate proportional to the value of the source signal x. Independent stochastic binary variables $\epsilon_1, \epsilon_2, \epsilon_3, \ldots, \epsilon_N$ define N auxiliary variables $x_1, x_2, x_3, \ldots, x_N$ defined as:

$$x_i = \epsilon_i x$$

Each of the N auxiliary variables $x_1, x_2, x_3, \ldots, x_N$ 1718 determines the state evolution of the weight of a corresponding switch, as described above. The Outstar learning model can be implemented in the same manner as the Instar learning model described above, but with the roles of signals x and y reversed.

VI. Simulation Results

The Instar learning model can be used to learn analog patterns. When the sink single y is fixed at 1 in the state evolution equation (2), the steady state solution becomes:

$$w = x$$

Figure 18:
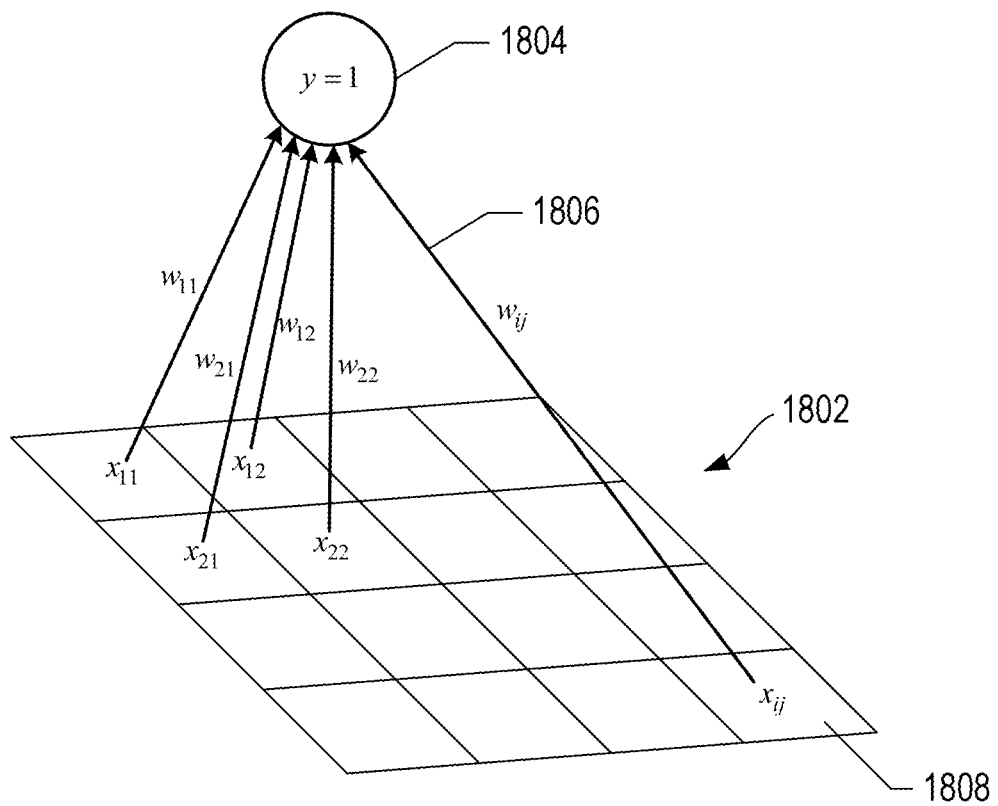
FIG. 18 shows an example two-dimensional array of input source signals fed through Instar synapses to a single sink neuron.

Consider for example the visualization example shown in FIG. 18. FIG. 18 shows a two-dimensional array of input source signals, $x_{ij}$, 1802 fed through Instar synapses to a single sink neuron 1804. The Instar synapses are represented by directional arrows, such as directional arrow 1806. The two-dimensional array 1802 corresponds to a gray-photograph, where each input source signal $x_{ij}$ corresponds to a gray-scale value associated with a pixel of the gray-scale photograph. For example, source signal $x_{ij}$ equal to 0 corresponds to a black pixel, $x_{ij}$ equal to 1 corresponds to a white pixel, and intermediate values correspond to a gray-scale value. As shown in FIG. 18, each source signal passes through a synapse with an associated weight $w_{ij}$.

Figure 19:
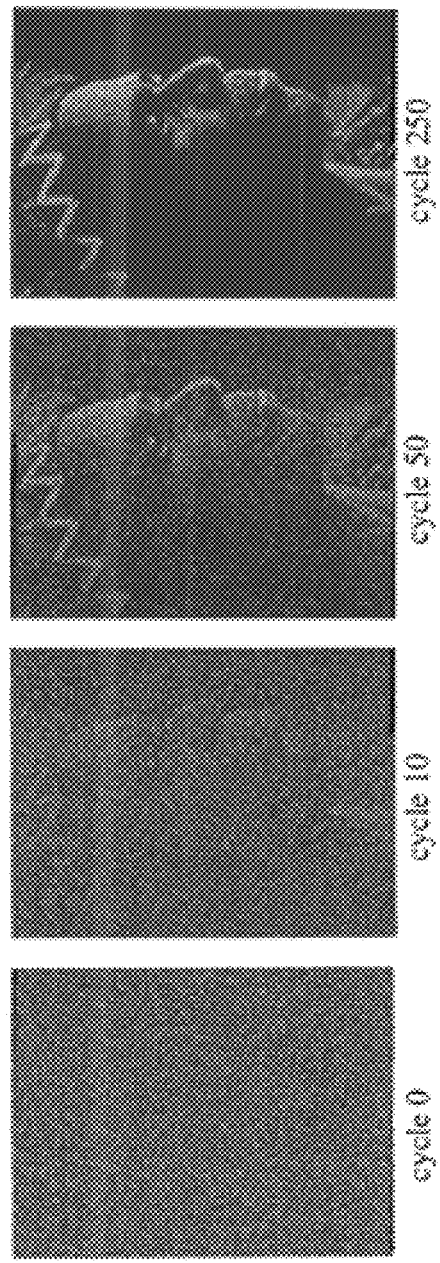
FIG. 19 shows simulation results with a gray-scale photograph.

FIG. 19 shows simulation results with a gray-scale photograph for the input signals represented in FIG. 18. In this network, N is equal to 16, ε is equal to 0.01, and y is equal to "1." The signals $x_{ij}$ correspond to the gray-scale pixels of the actual photograph. Each memristive switch $w_{ij}$ was randomly initialized to either a low- or a high-resistance state which equal probability as represented by the image produced at major cycle 0. Each pixel in the images shows that corresponding value of $\tilde{w}$, which is the sum of the state of the switches comprising the Instar synapse connecting that pixel to the sink neuron. FIG. 19 reveals that as the number of major cycle increases from 0 to 250, the weights $w_{ij}$ are adjusted so that the photograph is reproduced.

The foregoing description, for purposes of explanation, used specific nomenclature to provide a thorough understanding of the invention. However, it will be apparent to one skilled in the art that the specific details are not required in order to practice the invention. The foregoing descriptions of specific examples of the present invention are presented for purposes of illustration and description. They are not intended to be exhaustive of or to limit the invention to the precise forms disclosed. Obviously, many modifications and variations are possible in view of the above teachings. The examples are shown and described in order to best explain the principles of the invention and its practical applications, to thereby enable others skilled in the art to best utilize the invention and various examples with various modifications as are suited to the particular use contemplated. It is intended that the scope of the invention be defined by the following claims and their equivalents:

The invention claimed is:

1. A method comprising:
   receiving an analog input signal;
   transforming the analog input signal into an N-bit codeword, wherein each bit of the N-bit codeword is represented by an electronic pulse, wherein N is greater than one;
   loading the N-bit codeword into an N-bit circular shift register, wherein each bit of the N-bit circular shift register is coupled to a corresponding switch of N switches;
   sending each bit of the N-bit codeword from the N-bit circular shift register through the corresponding switch of the N switches, wherein each switch of the N switches applies a corresponding weight to the bit to produce a weighted bit;
   summing the N weighted bits using an integrator to obtain a summation of the N weighted bits; and
   outputting a signal corresponding to the summation of the N weighted bits produced by the N switches, the signal representing a synaptic transfer function.

2. The method of claim 1, wherein transforming the input signal into an N-bit codeword further comprises each pulse representing a bit as a high voltage or a low voltage of an electronic signal.

3. The method of claim 1, wherein loading the N-bit codeword into the N-bit circular shift register further comprises loading the N bits of the N-bit codeword in parallel into the N-bit circular shift register.

4. The method of claim 1, further comprising:
   circularly shifting each bit value of the N-bit codeword through each bit of the N-bit circular shift register.

5. The method of claim 4 further comprising:
   after each circular shift of the N-bit circular shift register, sending each shifted bit of the N-bit codeword from the N-bit circular shift register through one of the N switches.

6. The method of claim 5 further comprising:
   accumulating weighted bits after each circular shift of the N-bit circular shift register.

7. The method of claim 1 further comprising updating the weights of each switch prior to sending the N bits of the N-bit codeword.

8. The method of claim 1, wherein sending each bit of the N-bit codeword through one of N switches further comprises sending the N-bits through the N switches in parallel.

9. The method of claim 1, wherein each switch further comprises a memristor crossbar junction of a crossbar array.

10. The method of claim 9, wherein the crossbar array comprises:
    a first set of approximately parallel nanowires, wherein each nanowire in the first set is coupled to one bit of the N-bit circular shift register;
    a second set of approximately parallel nanowires, wherein each nanowire in the second set overlaps the nanowires in the first set.

11. The method of claim 1, wherein the integrator comprises a capacitor to store the sums of the weighted bits as electric charge.

12. The method of claim 1, wherein the integrator comprises a differential amplifier that receives each bit at an input.

13. The method of claim 1, wherein transforming the analog input signal into the N-bit codeword comprises using a thermometer encoding.

14. A system for modeling binary synaptic behavior comprising:
    a first set of approximately parallel nanowires, wherein each nanowire receives a pulse corresponding to a bit of an N-bit codeword;
    a second set of approximately parallel nanowires, wherein each nanowire in the second set overlaps the nanowires in the first set;
    a memristor located at each nanowire intersection, each memristor connects a nanowire in the first set to a nanowire in the second set and applies a weight to a bit of the N-bit codeword to produce a weighted bit; and
    at least one integrator, each integrator electronically connected to a nanowire in the second set and sums the weighted bits to produce a output representing a synaptic transfer function.

15. The system of claim 14 further comprising a circular shift register electronically connected to the first set of nanowires, the circular shift register circularly shifts the bit values of the N-bit codeword and sends each shifted bit through one of the N switches.

16. The system of claim 14, wherein each pulse further comprises a high voltage or a low voltage of an electronic signal.

17. The system of claim 14, wherein the integrator further comprises a capacitor that stores the sums of the weighted bits as electric charge.

18. The system of claim 14, wherein the integrator further comprises a differential amplifier that receives each bit at an input.

19. The system of claim 14 further comprising an analog-to-digital converter that converts an analog signal into the N-bit codeword.

* * * * *